(12) United States Patent
Inoue et al.

(10) Patent No.: US 11,095,266 B2
(45) Date of Patent: Aug. 17, 2021

(54) SLANTED APODIZATION FOR ACOUSTIC WAVE DEVICES

(71) Applicant: Qorvo US, Inc., Greensboro, NC (US)

(72) Inventors: Shogo Inoue, Longwood, FL (US);
Marc Solal, Longwood, FL (US)

(73) Assignee: Qorvo US, Inc., Greensboro, NC (US)

( * ) Notice: Subject to any disclaimer, the term of this patent is extended or adjusted under 35 U.S.C. 154(b) by 778 days.

(21) Appl. No.: 15/728,133

(22) Filed: Oct. 9, 2017

(65) Prior Publication Data
US 2018/0102760 A1    Apr. 12, 2018

Related U.S. Application Data

(60) Provisional application No. 62/405,478, filed on Oct. 7, 2016.

(51) Int. Cl.
*H03H 9/145* (2006.01)
*H03H 9/02* (2006.01)
(Continued)

(52) U.S. Cl.
CPC ..... *H03H 9/14558* (2013.01); *H01L 41/1873* (2013.01); *H03H 9/02574* (2013.01);
(Continued)

(58) Field of Classification Search
CPC ............. H03H 9/64; H03H 9/25; H03H 9/145
See application file for complete search history.

(56) References Cited

U.S. PATENT DOCUMENTS

| | | | |
|---|---|---|---|
| 5,113,115 A | * | 5/1992 | Mariani ................. G06G 7/195 |
| | | | 310/313 D |
| 6,445,265 B1 | | 9/2002 | Wright |

(Continued)

FOREIGN PATENT DOCUMENTS

| | | | |
|---|---|---|---|
| JP | 63082115 A | * | 4/1988 |
| JP | 06326553 A | * | 11/1994 |

(Continued)

OTHER PUBLICATIONS

Pastureaud, T., et al., "High-Frequency Surface Acoustic Waves Excited on Thin-Oriented LiNbO3 Single-Crystal Layers Transferred Onto Silicon," IEEE Transactions on Ultrasonics, Ferroelectrics, and Frequency Control, vol. 54, No. 4, Apr. 2007, pp. 870-876.

(Continued)

*Primary Examiner* — J. San Martin
(74) *Attorney, Agent, or Firm* — Withrow & Terranova, PLLC

(57) ABSTRACT

A device includes a die and an interdigital transducer on the die. The interdigital transducer includes a first bus bar, a second bus bar, and a number of electrode fingers. The first bus bar is parallel to the second bus bar. The electrode fingers are divided into a first set of electrode fingers and a second set of electrode fingers. The first set of electrode fingers extend obliquely from the first bus bar towards the second bus bar. The second set of electrode fingers extend obliquely from the second bus bar towards the first bus bar, and are parallel to and interleaved with the first set of electrode fingers. By providing the electrode fingers oblique to the bus bars, spurious transverse modes may be suppressed while maintaining the quality factor, electromechanical coupling coefficient, and capacitance of the device.

33 Claims, 16 Drawing Sheets

(51) Int. Cl.
*H01L 41/187* (2006.01)
*H03H 9/25* (2006.01)

(52) U.S. Cl.
CPC ...... *H03H 9/02992* (2013.01); *H03H 9/1452* (2013.01); *H03H 9/25* (2013.01)

(56) References Cited

U.S. PATENT DOCUMENTS

| | | | |
|---|---|---|---|
| 7,105,980 B2* | 9/2006 | Abbott | H03H 3/08 |
| | | | 310/313 A |
| 2003/0030513 A1* | 2/2003 | Yamazaki | H03H 9/02551 |
| | | | 333/195 |
| 2004/0135469 A1* | 7/2004 | Kanna | H03H 9/02551 |
| | | | 310/313 A |
| 2005/0127781 A1* | 6/2005 | Yamazaki | H03H 3/08 |
| | | | 310/313 A |
| 2007/0274371 A1 | 11/2007 | Penavaire et al. | |
| 2009/0267707 A1* | 10/2009 | Miura | H03H 9/1452 |
| | | | 333/193 |
| 2013/0088305 A1* | 4/2013 | Takata | H03H 9/6483 |
| | | | 333/133 |
| 2013/0099875 A1* | 4/2013 | Shimizu | H03H 9/25 |
| | | | 333/133 |
| 2014/0009036 A1* | 1/2014 | Iwamoto | H01L 41/053 |
| | | | 310/348 |
| 2014/0145557 A1* | 5/2014 | Tanaka | H03H 9/059 |
| | | | 310/313 D |
| 2016/0182010 A1* | 6/2016 | Nakamura | H03H 9/64 |
| | | | 333/193 |
| 2016/0261038 A1* | 9/2016 | Tanaka | H03H 9/02559 |
| 2016/0261248 A1* | 9/2016 | Grousset | H03H 9/02574 |
| 2016/0294361 A1* | 10/2016 | Yamane | H03H 9/6496 |
| 2017/0033756 A1 | 2/2017 | Inoue et al. | |
| 2017/0033764 A1 | 2/2017 | Inoue et al. | |
| 2017/0222618 A1 | 8/2017 | Inoue et al. | |
| 2017/0222622 A1 | 8/2017 | Solal et al. | |
| 2018/0102755 A1* | 4/2018 | Takamine | H03H 9/6496 |
| 2018/0109241 A1 | 4/2018 | Inoue et al. | |
| 2018/0109242 A1 | 4/2018 | Solel et al. | |
| 2020/0058842 A1* | 2/2020 | Akiyama | H03H 9/02897 |

FOREIGN PATENT DOCUMENTS

| | | | | |
|---|---|---|---|---|
| JP | 2010177819 A | * | 8/2010 | |
| JP | 2014239528 A | * | 12/2014 | |
| JP | 2016167652 A | * | 9/2016 | |
| JP | 2018026695 A | * | 2/2018 | ............... H03H 9/25 |

OTHER PUBLICATIONS

Potter, B.R., "Surface Acoustic Wave Slanted Correlators for Linear FM Pulse-Compressors," 1977 IEEE MTT-S International Microwave Symposium Digest, Jun. 21-23, 1977, San Diego, California, USA, pp. 318-320.

Solal, M., et al., "Oriented lithium niobate layers transferred on 4" [100] silicon wafer for RF SAW devices," Proceedings of the 2002 IEEE International Ultrasonics Symposium, Oct. 8-11, 2002, Munich, Germany, pp. 131-134.

Takai, T., et al., "I.H.P. SAW technology and its application to micro acoustic components," 2017 IEEE International Ultrasonics Symposium, Sep. 6-9, 2017, Washington, D.C., USA, pages.

* cited by examiner

SLANTED APODIZATION FOR ACOUSTIC WAVE DEVICES

RELATED APPLICATIONS

This application claims the benefit of provisional patent application Ser. No. 62/405,478, filed Oct. 7, 2016, the disclosure of which is hereby incorporated herein by reference in its entirety.

FIELD OF THE DISCLOSURE

The present disclosure relates to surface acoustic wave (SAW) devices, and in particular to SAW devices including interdigital electrodes for improved performance.

BACKGROUND

Acoustic wave devices are widely used in modern electronics. At a high level, acoustic wave devices include a piezoelectric material in contact with one or more electrodes. Piezoelectric materials acquire a charge when compressed, twisted, or distorted, and similarly compress, twist, or distort when a charge is applied to them. Accordingly, when an alternating electrical signal is applied to the one or more electrodes in contact with the piezoelectric material, a corresponding mechanical signal (i.e., an oscillation or vibration) is transduced therein. Based on the characteristics of the one or more electrodes on the piezoelectric material, the properties of the piezoelectric material, and other factors such as the shape of the acoustic wave device and other structures provided on the device, the mechanical signal transduced in the piezoelectric material exhibits a frequency dependence on the alternating electrical signal. Acoustic wave devices leverage this frequency dependence to provide one or more functions.

Exemplary acoustic wave devices include surface acoustic wave (SAW) resonators and bulk acoustic wave (BAW) resonators, which are increasingly used to form filters used in the transmission and reception of RF signals for communication. SAW resonators may be unguided or guided devices. An unguided SAW resonator is one including a relatively thick piezoelectric substrate. A guided SAW device is one including a substrate that is generally not piezoelectric and a relatively thin piezoelectric layer on the substrate. The substrate guides waves in the piezoelectric layer, which may provide desirable characteristics of the device in some circumstances. For purposes of illustration, FIG. 1A shows details of a conventional guided SAW device 10. The conventional guided SAW device 10 includes a die 12 with a substrate 14 and a piezoelectric layer 16 on the substrate 14, an interdigital transducer 18 on a surface of the piezoelectric layer 16, a first reflector structure 20A on the surface of the piezoelectric layer 16 adjacent to the interdigital transducer 18, and a second reflector structure 20B on the surface of the piezoelectric layer 16 adjacent to the interdigital transducer 18 opposite the first reflector structure 20A.

The interdigital transducer 18 includes a first comb electrode 22A and a second comb electrode 22B, each of which include a number of electrode fingers 24 that are interleaved with one another as shown. Specifically, the first comb electrode 22A includes a first bus bar 26A and a first set of electrode fingers 24A, while the second comb electrode 22B includes a second bus bar 26B and a second set of electrode fingers 24B. The first set of electrode fingers 24A extend perpendicularly from the first bus bar 26A towards the second bus bar 26B, while the second set of electrode fingers 24B extend perpendicularly from the second bus bar 26B towards the first bus bar 26A. The first comb electrode 22A and the second comb electrode 22B may also include a number of dummy electrodes 28. Specifically, the first comb electrode 22A may include a first set of dummy electrodes 28A that alternate with the first set of electrode fingers 24A and extend perpendicularly from the first bus bar 26A towards a corresponding one of the second set of electrode fingers 24B. The second comb electrode 22B may include a second set of dummy electrodes 28B that alternate with the second set of electrode fingers 24B and extend perpendicularly from the second bus bar 26B towards a corresponding one of the first set of electrode fingers 24A. The dummy electrodes 28 are surrounded on both sides by electrode fingers 24 having the same potential and thus generally do not contribute to transducing an acoustic wave as discussed below.

A distance between adjacent electrode fingers 24 of the first comb electrode 22A and the second comb electrode 22B defines an electrode period P of the interdigital transducer 18. The electrode period P defines a center frequency wavelength 2L of the conventional guided SAW device 10, wherein the center frequency wavelength is the wavelength of the primary surface acoustic wave transduced in the piezoelectric layer 16. As defined herein, the center frequency wavelength 2L of a conventional guided SAW device 10 is two times the electrode period 2P. A ratio between a width W of the electrode fingers 24 in a pair of adjacent electrode fingers 24 and the electrode period P of the adjacent electrode fingers 24 defines a metallization ratio M of the interdigital transducer 18

$$\left(\text{i.e., } M = \frac{W}{P}\right).$$

The electrode period P and the metallization ratio M together characterize the interdigital transducer 18 and may determine one or more operational parameters of the conventional guided SAW device 10. For example, the electrode period P and the metallization ratio M of the interdigital transducer 18, along with other factors such as the properties of the piezoelectric layer 16, the properties of the substrate 14, and the metal nature and thickness may determine a series resonant frequency of the device.

In operation, an alternating electrical input signal provided between the first comb electrode 22A and the second comb electrode 22B is transduced into a mechanical signal in the piezoelectric layer 16, resulting in one or more acoustic waves therein. In the case of the conventional guided SAW device 10, the resulting acoustic waves are predominately surface acoustic waves. As discussed above, due to the electrode period P and the metallization ratio M of the interdigital transducer 18, the characteristics of the material of the piezoelectric layer 16, and other factors, the magnitude and frequency of the acoustic waves transduced in the piezoelectric layer 16 are dependent on the frequency of the alternating electrical input signal. This frequency dependence is often described in terms of changes in the impedance and/or a phase shift between the first comb electrode 22A and the second comb electrode 22B with respect to the frequency of the alternating electrical input signal. The first reflector structure 20A and the second reflector structure 20B reflect the acoustic waves in the piezoelectric layer 16 back towards the interdigital transducer 18 to confine the acoustic waves in the area surrounding the interdigital transducer 18.

It is generally desirable to maximize the quality factor, electromechanical coupling coefficient, and capacitance of acoustic wave devices such as the conventional guided SAW device 10. Further, it is desirable to reduce the effect of spurious modes on the conventional guided SAW device 10, as these effects may interfere with proper operation of the device. This is especially true for acoustic wave devices used in RF applications. Finally, as the size of consumer electronics continues to decrease, it is also desirable to provide acoustic wave devices with small footprints and thus die sizes.

FIG. 1B shows a top view of the interdigital transducer 18. For context, the first reflector structure 20A and the second reflector structure 20B are also shown. The interdigital transducer 18 shown in FIG. 1B is substantially similar to that shown in FIG. 1A, but includes additional electrode fingers 24 and dummy electrodes 28. Further, the first reflector structure 20A and the second reflector structure 20B are larger in FIG. 1B. While the interdigital transducer 18 shown in FIGS. 1A and 1B may provide suitable performance in some cases, a conventional guided SAW device 10 including this interdigital transducer 18 may include several spurious modes that interfere with the operation of the device. Specifically, the interdigital transducer 18 shown in FIGS. 1A and 1B may introduce significant spurious transverse modes in the conventional guided SAW device 10.

FIG. 2 shows a top view of the interdigital transducer 18 wherein the interdigital transducer 18 is apodized using conventional techniques (referred to herein as "regular apodization") in an effort to reduce spurious mode effects. As illustrated in FIG. 2, a length of the electrode fingers 24 and dummy electrodes 28 of the interdigital transducer 18 is varied along the direction of wave propagation in the device. Regular apodization of the interdigital transducer 18 may be used to suppress the effects of spurious transverse modes. However, regular apodization comes at the cost of a reduction in quality factor, electromechanical coupling coefficient, and capacitance of the device (due to a decreased active area of the interdigital transducer 18 i.e., the area of the interdigital transducer 18 in which the electrode fingers 24 from the first comb electrode 22A and the second comb electrode 22B overlap). Specifically, a capacitance of a SAW device including the apodized interdigital transducer 18 is 36% less than a similarly sized device without apodization. Accordingly, the size of a SAW device incorporating the interdigital transducer 18 shown in FIG. 2 must be increased by 56% in order to maintain the same capacitance as a SAW device incorporating the interdigital transducer illustrated in FIG. 1B.

As illustrated by the discussion above with respect to the interdigital transducer 18 shown in FIG. 2, regular apodization provides a trade-off between the suppression of spurious mode effects and other performance parameters such as quality factor, electromechanical coupling coefficient, and capacitance. As discussed above it is desirable to maximize the quality factor, electromechanical coupling coefficient, and capacitance of an acoustic wave device while minimizing the die size thereof. Accordingly, there is a need for an improved acoustic wave device capable of providing a high quality factor, electromechanical coupling coefficient, and capacitance while minimizing die size.

SUMMARY

The present disclosure relates to guided surface acoustic wave (SAW) devices, and in particular to guided SAW devices including interdigital electrodes for improved performance. In one embodiment, a guided SAW device includes a die and an interdigital transducer on the die. The die includes a substrate and a piezoelectric layer on the substrate. A thickness of the piezoelectric layer may be less than five times a wavelength of a primary surface acoustic wave propagated in the piezoelectric layer (L). The interdigital transducer includes a first bus bar, a second bus bar, and a number of electrode fingers. The first bus bar is parallel to the second bus bar. The electrode fingers are divided into a first set of electrode fingers and a second set of electrode fingers. The first set of electrode fingers extend obliquely from the first bus bar towards the second bus bar. The second set of electrode fingers extend obliquely from the second bus bar towards the first bus bar, and are parallel to and interleaved with the first set of electrode fingers. By providing the electrode fingers oblique to the bus bars, spurious transverse modes may be suppressed while maintaining the quality factor, electromechanical coupling coefficient, and capacitance of the device.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1A:
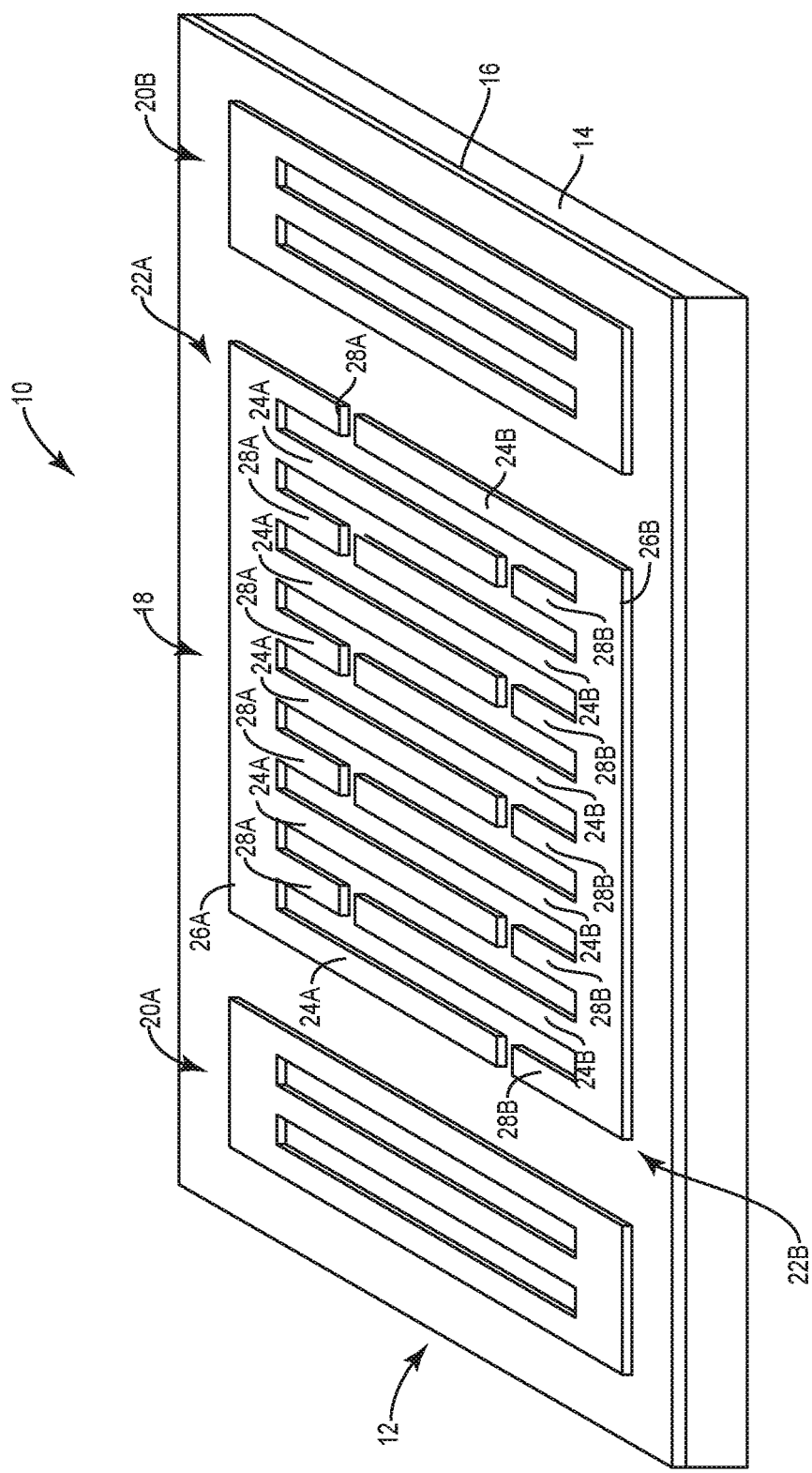
FIG. 1A illustrates a conventional guided surface acoustic wave (SAW) device.
Figure 1B:
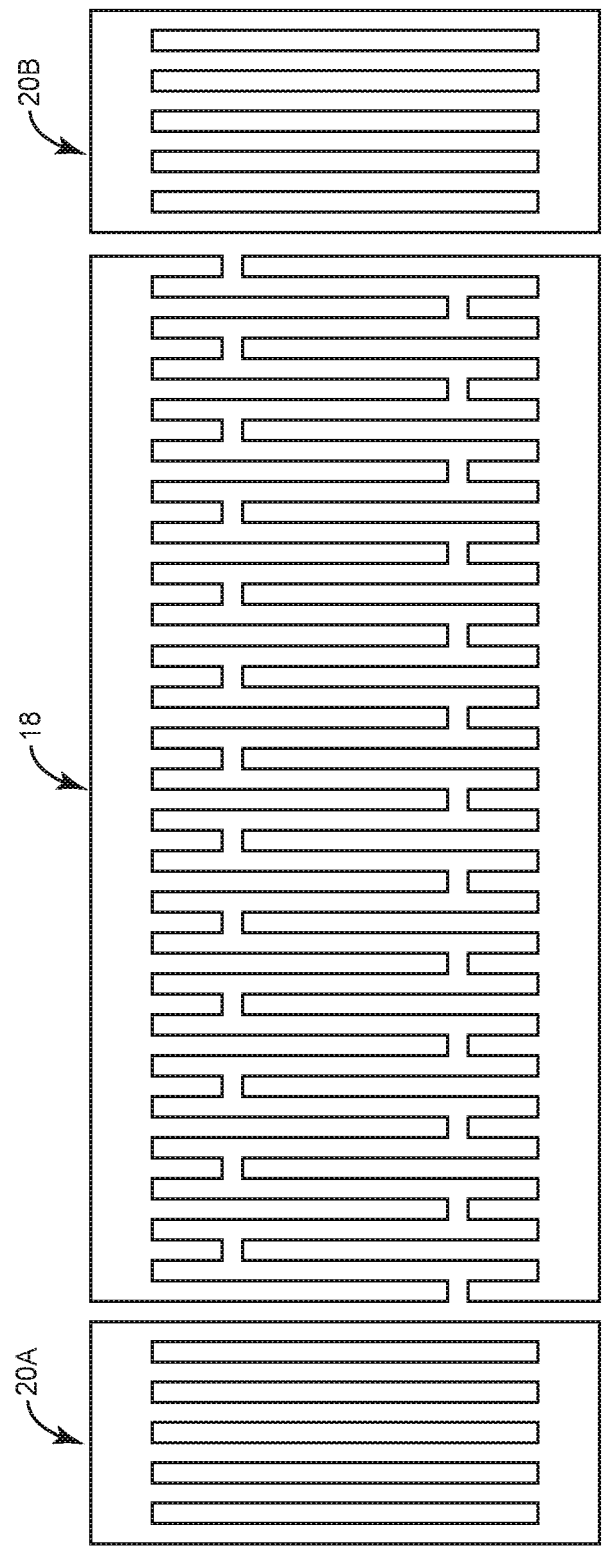
FIG. 1B is a top view of a conventional interdigital transducer.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 3A:
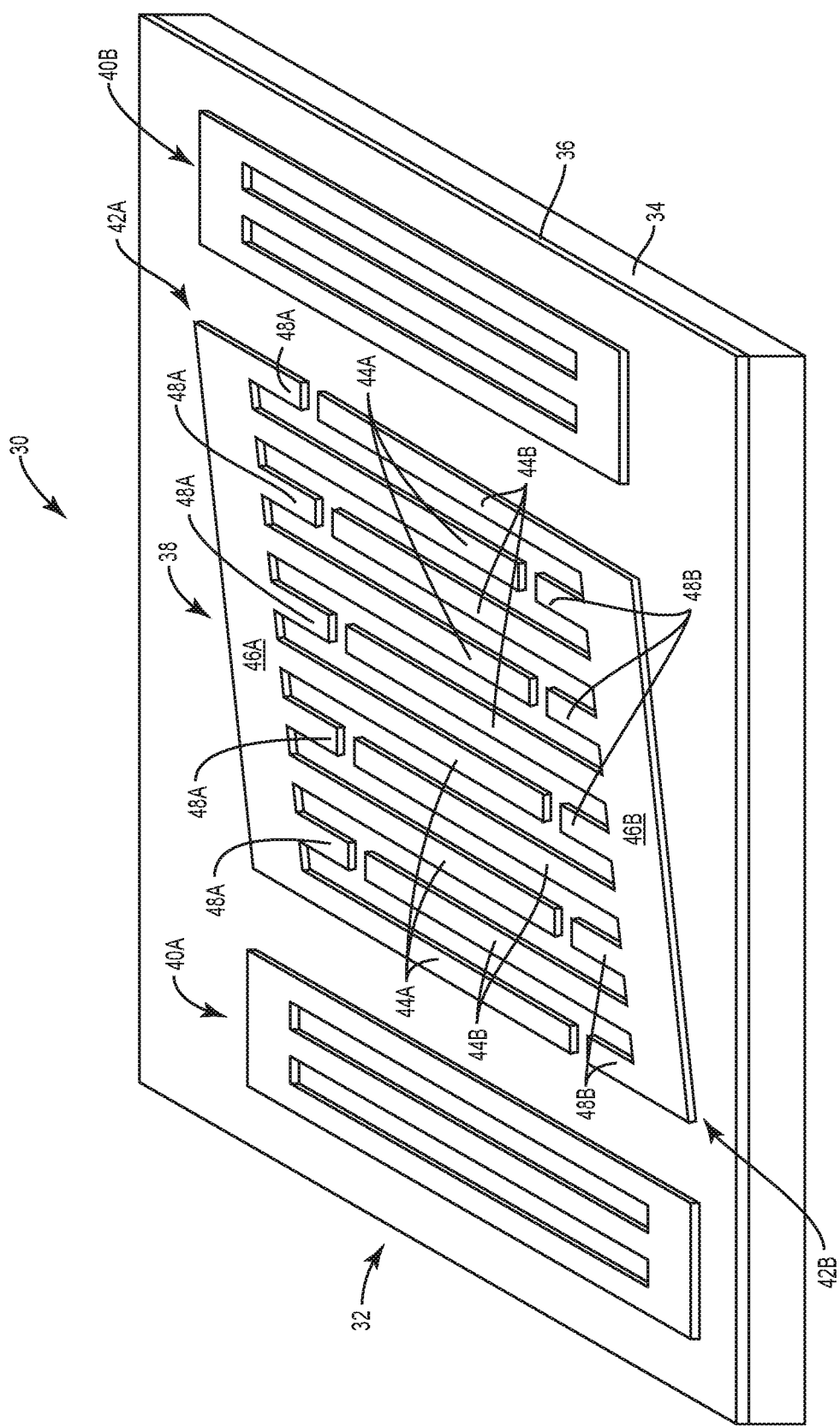
FIG. 3A illustrates a guided SAW device according to one embodiment of the present disclosure.

FIG. 3A shows a guided surface acoustic wave (SAW) device 30 according to one embodiment of the present disclosure. The guided SAW device 30 includes a die 32 with a substrate 34 and a piezoelectric layer 36 on the substrate 34, an interdigital transducer 38 on a surface of the piezoelectric layer 36, a first reflector structure 40A on a surface of the piezoelectric layer 36 adjacent to the interdigital transducer 38, and a second reflector structure 40B on the surface of the piezoelectric layer 36 adjacent to the interdigital transducer 38 opposite the first reflector structure 40A.

The interdigital transducer 38 includes a first comb electrode 42A and a second comb electrode 42B, each of which include a number of electrode fingers 44 that are interleaved with one another as shown. Specifically, the first comb electrode 42A includes a first bus bar 46A and a first set of electrode fingers 44A, while the second comb electrode 42B includes a second bus bar 46B and a second set of electrode fingers 44B. The first bus bar 46A is parallel to the second bus bar 46B. The first set of electrode fingers 44A extend obliquely from the first bus bar 46A towards the second bus bar 46B, while the second set of electrode fingers 44B extend obliquely from the second bus bar 46B towards the first bus bar 46A. That is, the first set of electrode fingers 44A are not parallel to or perpendicular to the first bus bar 46A, and similarly the second set of electrode fingers 44B are not parallel to or perpendicular to the second bus bar 46B. The first set of electrode fingers 44A and the second set of electrode fingers 44B are parallel to one another. The first comb electrode 42A and the second comb electrode 42B may also include a number of dummy electrodes 48. Specifically, the first comb electrode 42A may include a first set of dummy electrodes 48A that alternate with the first set of electrode fingers 44A and extend obliquely from the first bus bar 46A towards a corresponding one of the second set of electrode fingers 44B. The second comb electrode 42B may include a second set of dummy electrodes 48B that alternate with the second set of electrode fingers 44B and extend obliquely from the second bus bar 46B towards a corresponding one of the first set of electrode fingers 44A. The dummy electrodes 48 are parallel to the electrode fingers 44. Since the dummy electrodes 48 are surrounded on both sides by electrode fingers 44 having the same potential, they generally do not contribute to transducing an acoustic wave as discussed below.

A distance between adjacent electrode fingers 44 of the first comb electrode 42A and the second comb electrode 42B defines an electrode period P of the interdigital transducer 38. The electrode period P defines a center frequency wavelength 2L of the guided SAW device 30, wherein the center frequency wavelength 2L is the wavelength of the primary SAW wave transduced in the piezoelectric layer 36. Normally, the center frequency wavelength of a conventional guided SAW device 10 is two times the electrode period 2P. A ratio between a width W of the electrode fingers 44 in a pair of adjacent electrode fingers 44 and the electrode period P of the adjacent electrode fingers 44 defines a metallization ratio M of the interdigital transducer (i.e., $M = \frac{W}{P}$).

The electrode period P and the metallization ratio M together characterize the interdigital transducer 38 and may determine one or more operational parameters of the guided SAW device 30. For example, the electrode period P and the metallization ratio M of the interdigital transducer 38, along with other factors such as the shape of the interdigital transducer 38 and the properties of the piezoelectric layer 36 may determine a series resonant frequency, of the guided SAW device 30.

In operation, an alternating electrical input signal provided between the first comb electrode 40A and the second comb electrode 40B is transduced into a mechanical signal in the piezoelectric layer 36, resulting in one or more acoustic waves therein. In the case of the guided SAW device 30, the resulting acoustic waves are predominantly surface acoustic waves. However, the principles of the present disclosure may find application in other acoustic wave devices as well. As discussed above, due to the electrode period P and the metallization ratio M of the interdigital transducer 38, the shape of the interdigital transducer 38, the characteristics of the piezoelectric layer 36, and other factors, the magnitude and frequency of the acoustic waves transduced in the piezoelectric layer 36 are dependent on the frequency of the alternating electrical input signal. This frequency dependence is often described in terms of changes in the impedance and/or a phase shift between the first comb electrode 42A and the second comb electrode 42B with respect to the frequency of the alternating input signal. The first reflector structure 40A and the second reflector structure 40B reflect the acoustic waves in the piezoelectric layer back towards the interdigital transducer 38 to confine the acoustic waves in the area surrounding the interdigital transducer 38.

Figure 2:
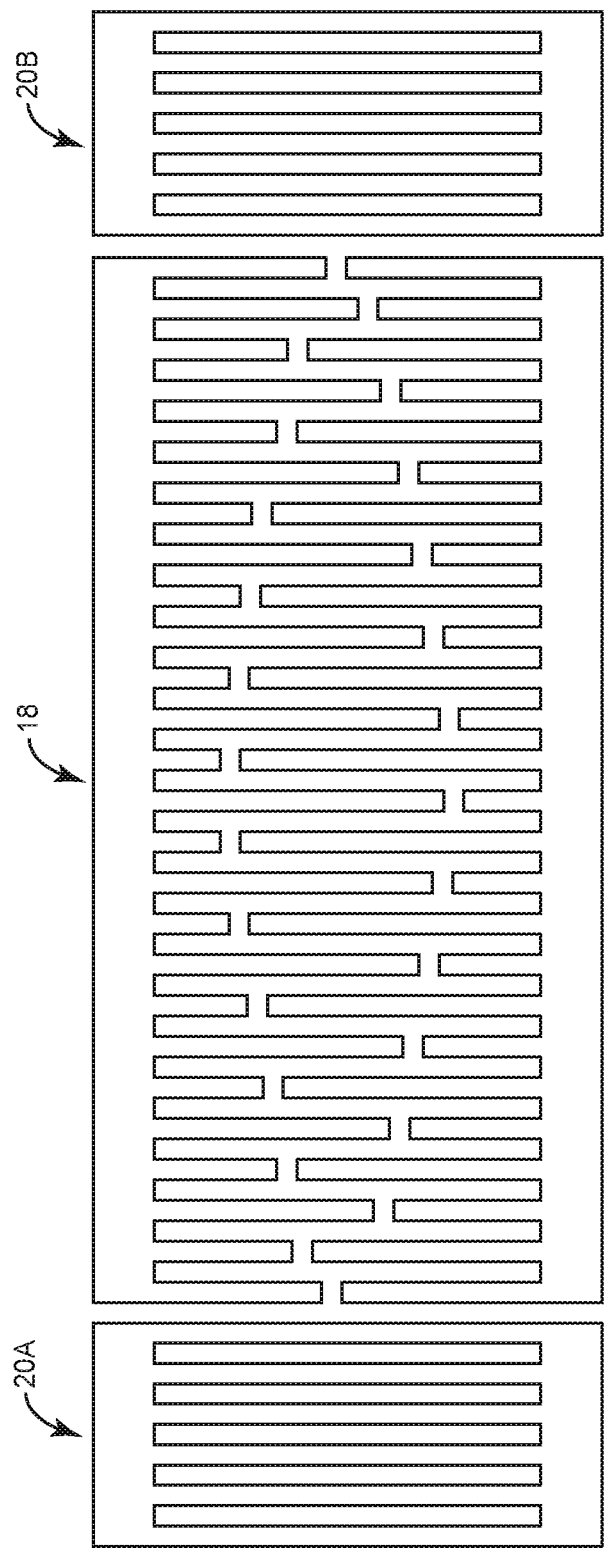
FIG. 2 is a top view of a conventional interdigital transducer including apodization according to conventional techniques.

As discussed above, it is generally desirable to maximize the quality factor, electromechanical coupling coefficient, and capacitance of acoustic wave devices such as the guided SAW device 30. This is especially true for acoustic wave devices used in RF applications. Further, it is desirable to minimize the size of the die 32 and any spurious mode effects. To do so, the interdigital transducer 38 is apodized in a slanted manner as illustrated in FIG. 3A, wherein the electrode fingers 44 extend obliquely from the first bus bar 46A and the second bus bar 46B as shown rather than perpendicularly as in conventional designs. The slanted apodization of the interdigital transducer 38 increases the quality factor and electromechanical coupling factor and the capacitance of the guided SAW device 30 when compared to the regularly apodized SAW device shown in FIG. 2. An active surface area of the interdigital transducer 38 on the die 32 is larger than that of a conventionally (or regularly) apodized interdigital transducer, thereby decreasing the size of the die 32 compared to conventional apodization. Spurious modes generally found in conventional guided SAW devices are also reduced. Specifically, transverse modes may be significantly reduced in the guided SAW device 30.

In various embodiments, an angle between the bus bars 46 and the electrode fingers 44 may be between 3° and 18° or −18° and −3°, where these angles are relative to a normal (90°) from the bus bars 46 as shown in the drawings. More specifically, an angle between the bus bars 46 and the electrode fingers 44 may be between 5° and 15° or −15° and −5°.

The substrate 34 may comprise silicon, sapphire, spinel, quartz, a ceramic material, or any other suitable material. The piezoelectric layer 36 may comprise lithium tantalate or lithium niobate. The improvements to the interdigital transducer 38 may be most beneficial for acoustic wave devices that experience a high magnitude of transverse modes. Such transverse modes may be predominant when the thickness of the piezoelectric layer 36 is below a certain value, such as below ten times the electrode period P or five times the center frequency wavelength 2L of the guided SAW device 30. In particular, these transverse modes may significantly affect device performance when the thickness of the piezoelectric layer 36 is below two times the center frequency wavelength 22, and more specifically less than the center frequency wavelength λ.

Figure 3B:
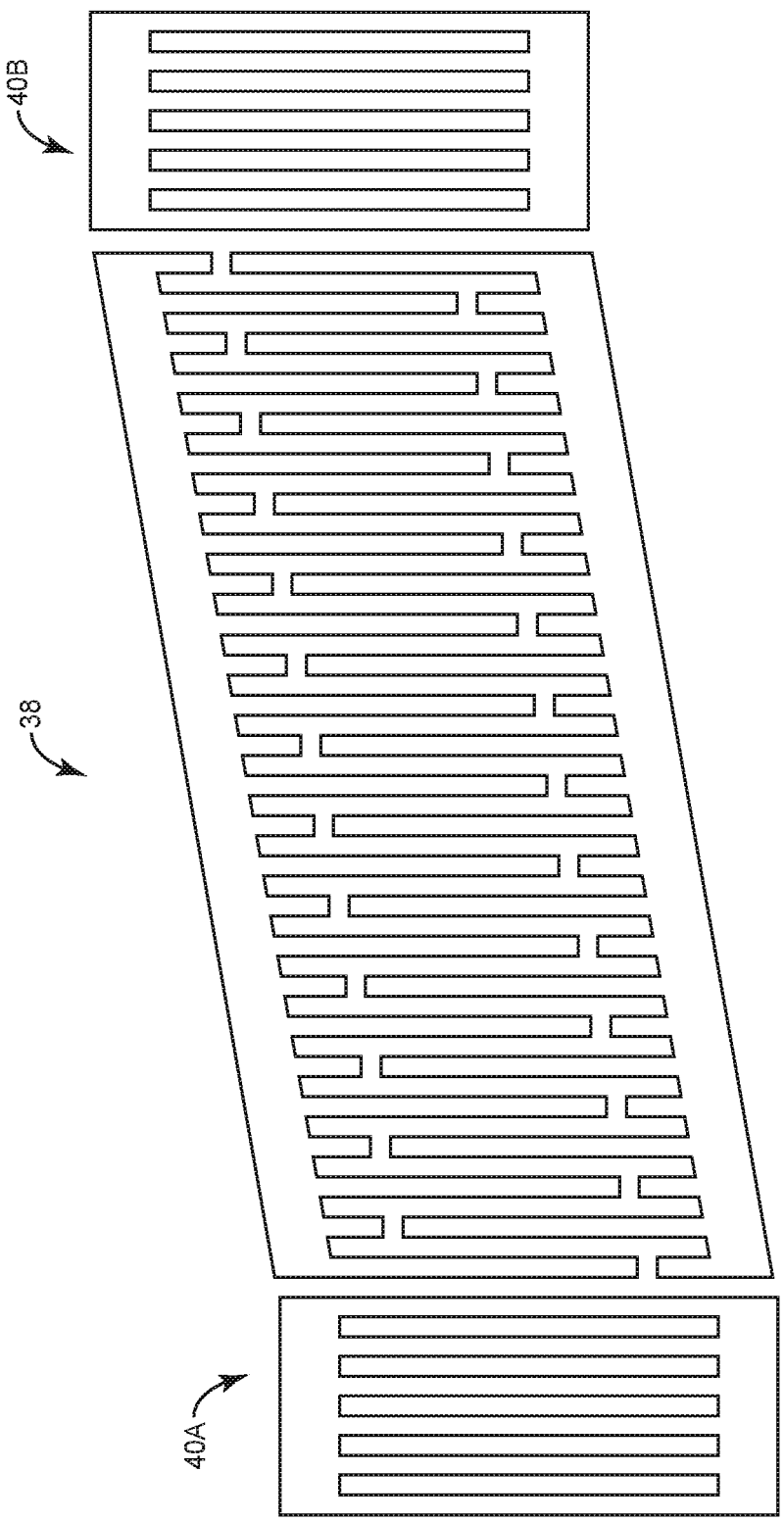
FIG. 3B is a top view of an interdigital transducer with slanted apodization according to one embodiment of the present disclosure.

FIG. 3B shows a top view of the interdigital transducer 38 according to one embodiment of the present disclosure. For context, the first reflector structure 40A and the second reflector structure 40B are also shown. The interdigital transducer 38 shown in FIG. 3B is substantially similar to that shown in FIG. 3A, but includes additional fingers and dummy electrodes 48. Further, the first reflector structure 40A and the second reflector structure 40B are larger in FIG. 3B.

Figure 4A:
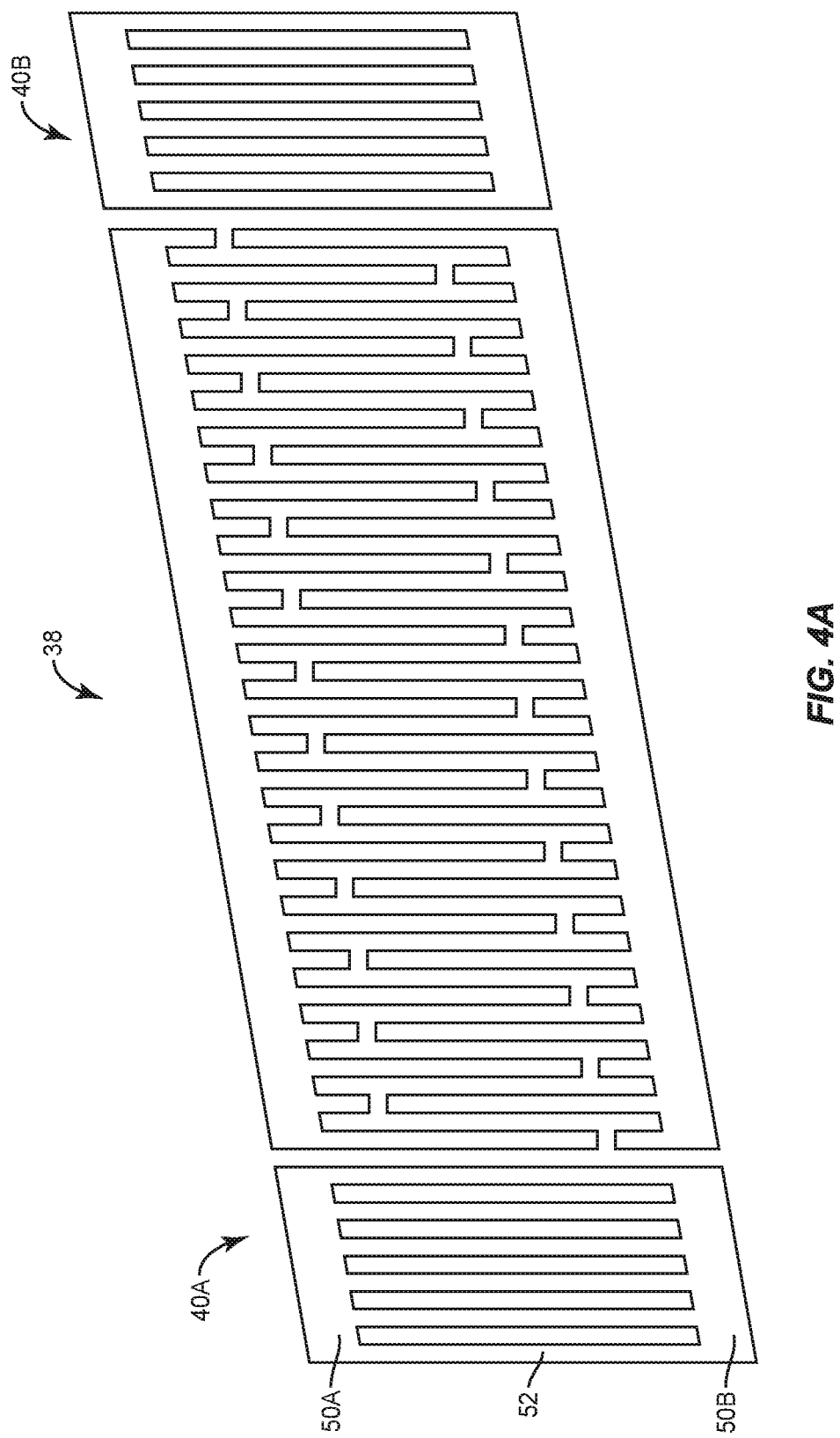
FIGS. 4A through 4D are top views of interdigital transducers with slanted apodization according to various embodiments of the present disclosure.

FIG. 4A shows a top view of the interdigital transducer 38 according to one embodiment of the present disclosure. For context, the first reflector structure 40A and the second reflector structure 40B are also shown. The interdigital transducer 38 shown in FIG. 4A is substantially similar to that shown in FIG. 3A except that the first reflector structure 40A and the second reflector structure 40B are slanted and aligned with the interdigital transducer 38. Each one of the first reflector structure 40A and the second reflector structure 40B includes a first reflector bus bar 50A and a second reflector bus bar 50B, which are parallel to one another. The first reflector bus bar 50A may be collinear with the first bus bar 46A (46A is not shown in FIG. 4A). The second reflector bus bar 50B may be collinear with the second bus bar 46B (46B is not shown in FIG. 4A). A number of reflector bars 52 may extend obliquely between the first reflector bus bar 50A and the second reflector bus bar 50B such that the first reflector structure 40A and the second reflector structure 40B are slanted as shown.

Figure 4B:
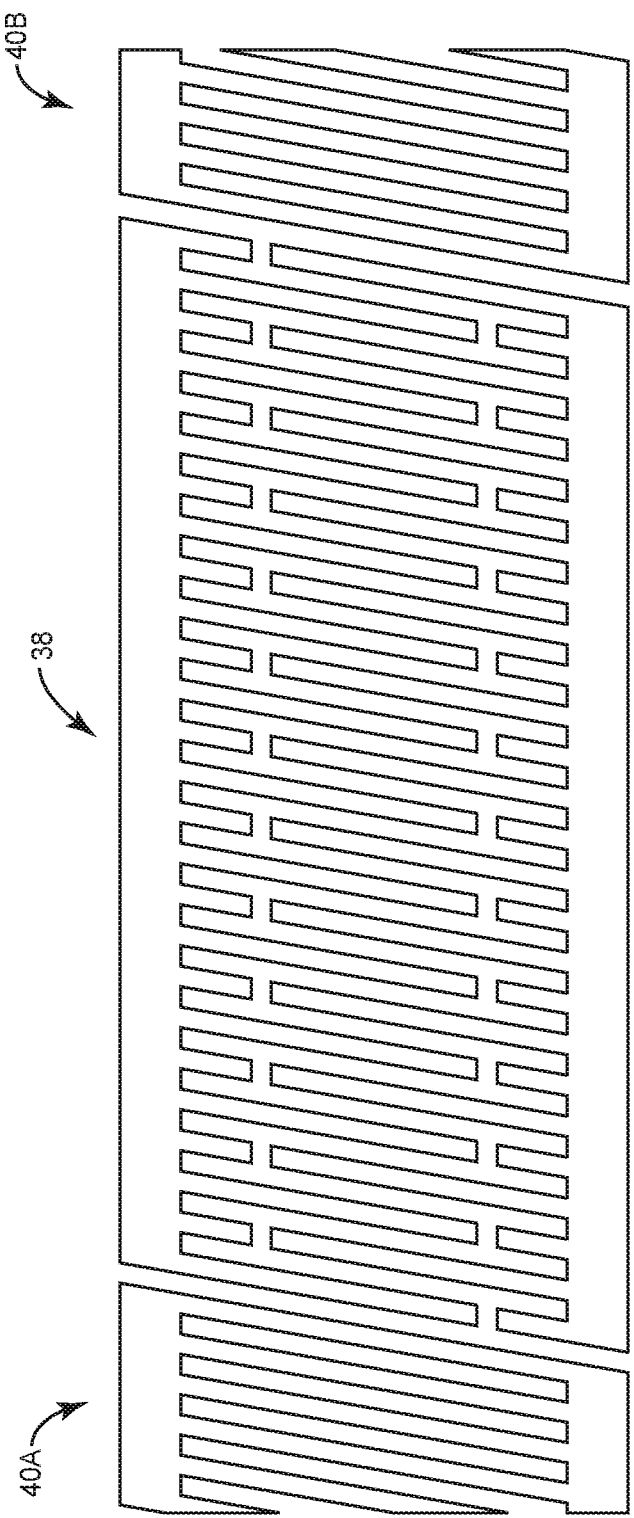

FIG. 4B shows a top view of the interdigital transducer 38 according to one embodiment of the present disclosure. For context, the first reflector structure 40A and the second reflector structure 40B are also shown. The interdigital transducer 38 shown in FIG. 4B is similar to that shown in FIG. 4A except that the interdigital transducer 38 is rotated and the outside edges of the first reflector structure 40A and the second reflector structure 40B are clipped such that the reflector structures 40 are trapezoidal rather than parallelogrammatic and the outer perimeter of the interdigital transducer 38 and the reflector structures 40 is rectangular rather than parallelogrammatic. The reflector structures 40 may perform their purpose while clipped in this manner with adequate performance while reducing the surface area of the interdigital transducer 38 and reflector structures when compared to the interdigital transducer 38 shown in FIG. 4A. The lateral edges of the first reflector structure 40A and the second reflector structure 40B may be clipped by respective lateral edges of the die 32 such that the interdigital transducer 38 and the reflector structures 40 are arranged edge-to-edge on the die 32.

Figure 4C:
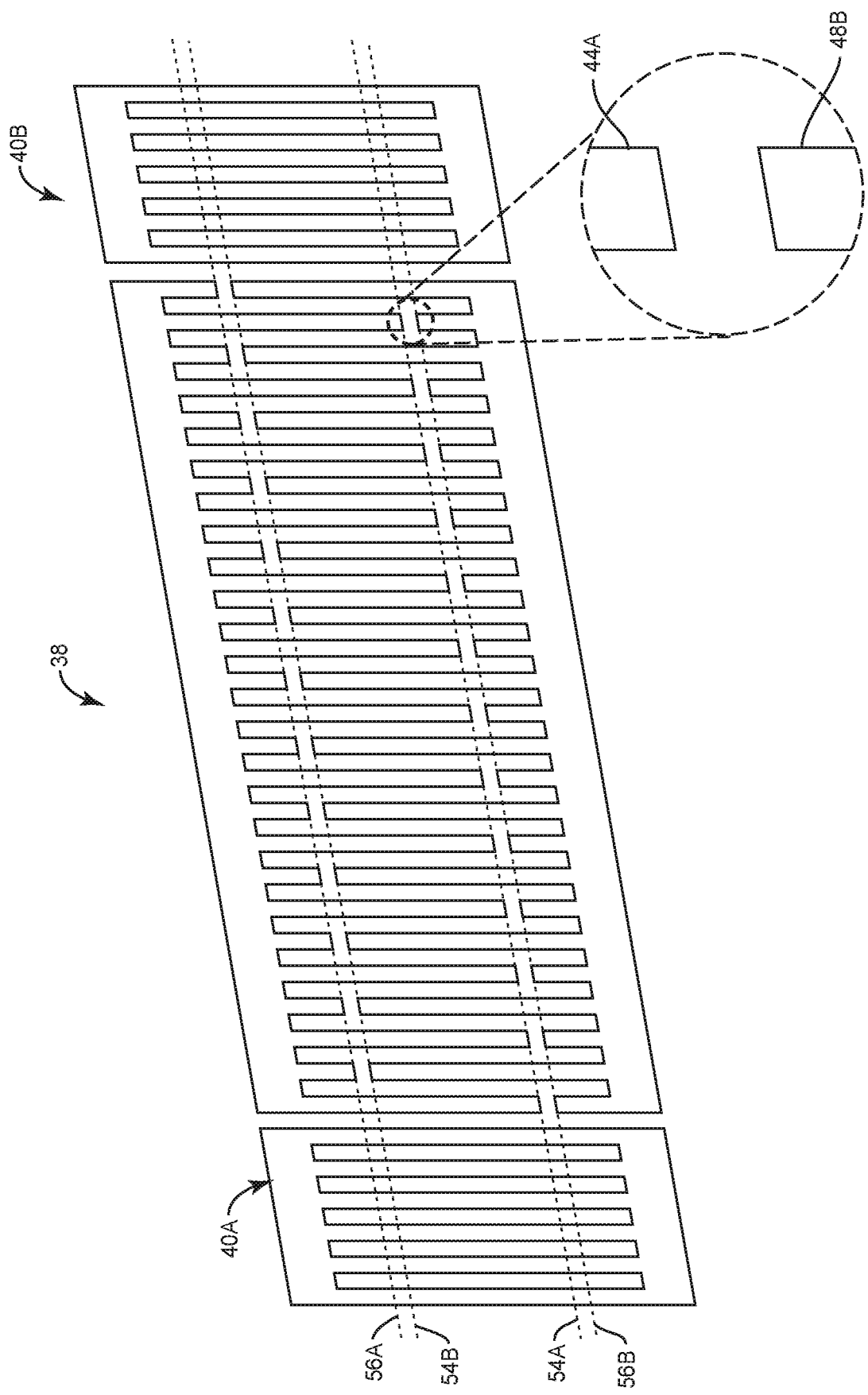

FIG. 4C shows a top view of the interdigital transducer 38 according to one embodiment of the present disclosure. For context, the first reflector structure 40A and the second reflector structure 40B are also shown. The interdigital transducer 38 shown in FIG. 4C is substantially similar to that shown in FIG. 4A, except that an edge shape of each one of the electrode fingers 44 and each one of the dummy electrodes 48 is slanted to be parallel to the first bus bar 46A and the second bus bar 46B such that the electrode fingers 44 and the dummy electrodes 48 are not rectangular. Specifically, the first set of electrode fingers 44A extend obliquely from the first bus bar 46A towards a first electrode finger termination edge 54A. The first set of dummy electrodes 48A extend obliquely from the first bus bar 46A towards a first dummy electrode termination edge 56A. The second set of electrode fingers 44B extend obliquely from the second bus bar 46B and a second electrode finger termination edge 54B. The second set of dummy electrodes 48B extend obliquely from the second bus bar 46B towards a second dummy electrode termination edge 56B.

The first electrode finger termination edge 54A, the second electrode finger termination edge 54B, the first dummy electrode termination edge 56A, and the second dummy electrode termination edge 56B are parallel to one another and to the first bus bar 46A and the second bus bar 46B. Further, the first electrode finger termination edge 54A and the second dummy electrode termination edge 56B are separated from one another by a gap. Similarly, the second electrode finger termination edge 54B and the first dummy electrode termination edge 56A are separated from one another by a gap. An end of each one of the first set of electrode fingers 44A is aligned with the first electrode finger termination edge 54A and thus parallel with the first bus bar 46A. An end of each one of the second set of electrode fingers 44B is aligned with the second electrode finger termination edge 54B and thus parallel with the second bus bar 46B. An end of each one of the first set of dummy electrodes 48A is aligned with the first dummy electrode termination edge 56A and thus parallel to the first bus bar 46A. An end of each one of the second set of dummy electrodes 48B is aligned with the second dummy electrode termination edge 56B and thus parallel to the second bus bar 46B. The result is that the electrode fingers 46 and the dummy electrodes 48 are not rectangular, and the gap between the electrode fingers 46 and their corresponding dummy electrodes 48 is slanted in a parallel manner to the bus bars 46. In one embodiment, a distance between the first bus bar 46A and the first dummy electrode termination edge 54A is greater than 1λ and a distance between the second bus bar 46B and the second dummy electrode termination edge 54B is greater than 1λ.

Figure 4D:
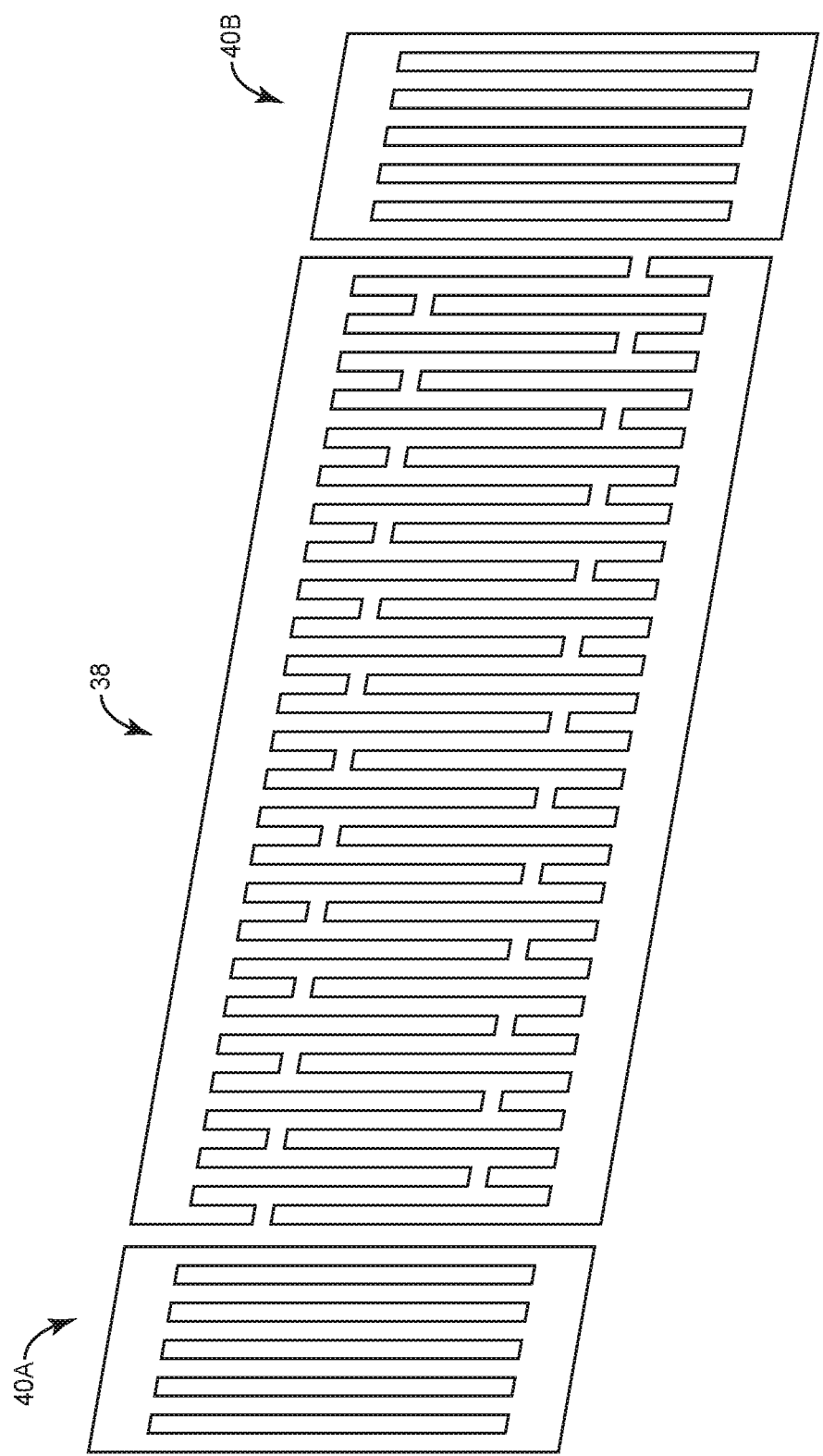

FIG. 4D shows a top view of the interdigital transducer 38 according to one embodiment of the present disclosure. For context, the first reflector structure 40A and the second reflector structure 40B are also shown. The interdigital transducer 38 shown in FIG. 4D is substantially similar to that shown in FIG. 4A, except that it is turned the opposite direction to illustrate that the interdigital transducer 38 may be oriented in any direction with respect to a substrate on which it is provided without departing from the principles described herein.

Figure 5:
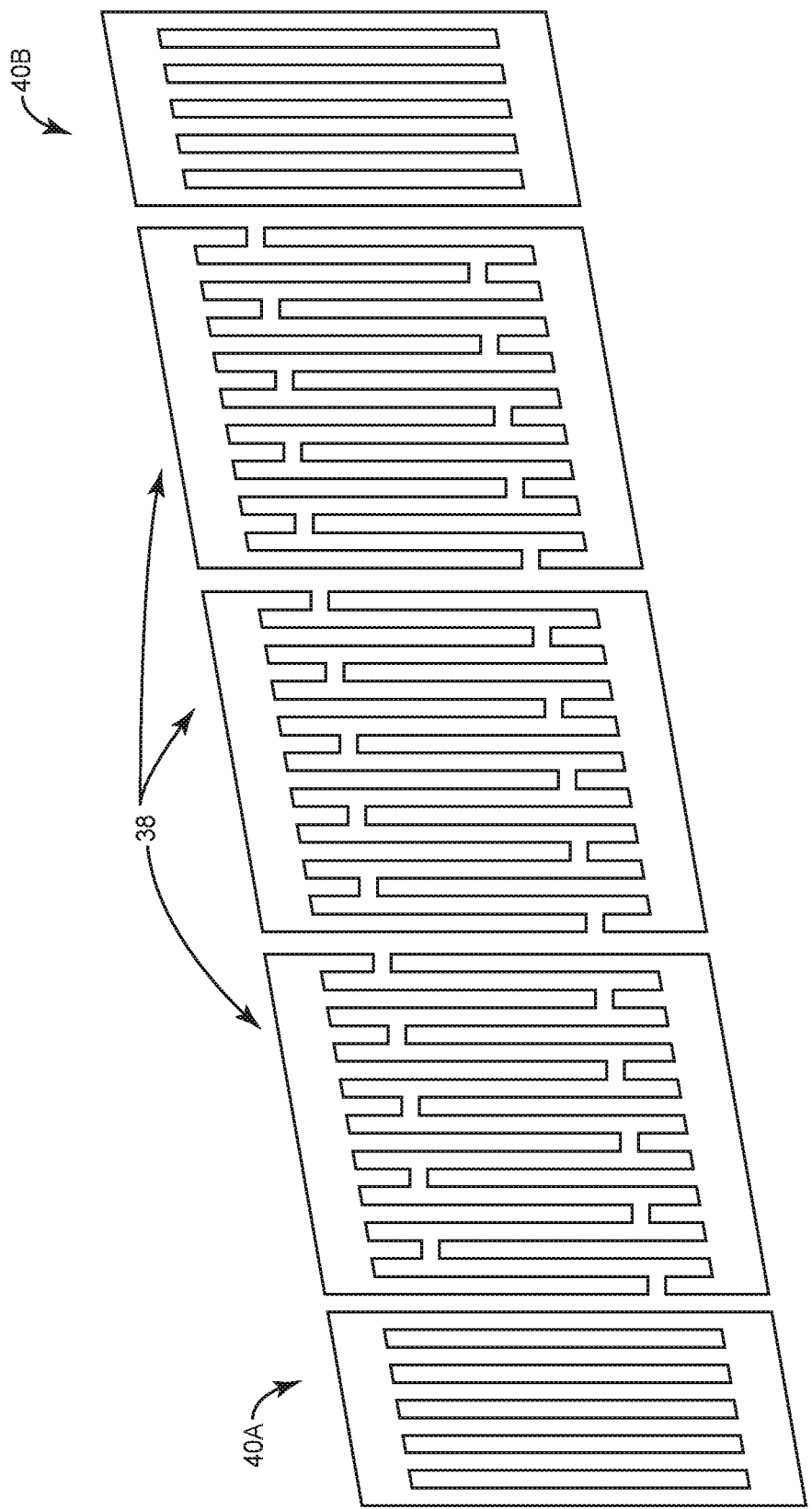
FIG. 5 is a top view of multiple interdigital transducers arranged to form a coupled resonator filter with slanted apodization according to one embodiment of the present disclosure.

FIG. 5 shows a top view of multiple interdigital transducers 38 arranged adjacent to one another to form a coupled resonator filter. For context, the first reflector structure 40A and the second reflector structure 40B are also shown. The interdigital transducers 38 shown in FIG. 5 are substantially similar to those discussed above, and thus the details thereof will not be repeated. The interdigital transducers 38 are aligned with one another such that the first bus bar 46A of each one of the interdigital transducers 38 are collinear, the second bus bar 46B of each one of the interdigital transducers 38 are collinear, and the electrode fingers 48 are parallel to one another. Similarly, the first reflector bus bar 50A and the second reflector bus bar 50B of each one of the reflector structures 40 are collinear with the first bus bar 46A of each one of the interdigital transducers 38 and the second bus bar 46B of each one of the interdigital transducers 38, respectively, and the reflector bars 52 of each one of the reflector structures 40 are parallel to the electrode fingers 48 of the interdigital transducers 38. While only three interdigital transducers 38 are shown in FIG. 5, those skilled in the art will appreciate that any number of interdigital transducers 38 may be provided and arranged in any number of different ways without departing from the principles of the present disclosure.

Figures 6A, 6B:
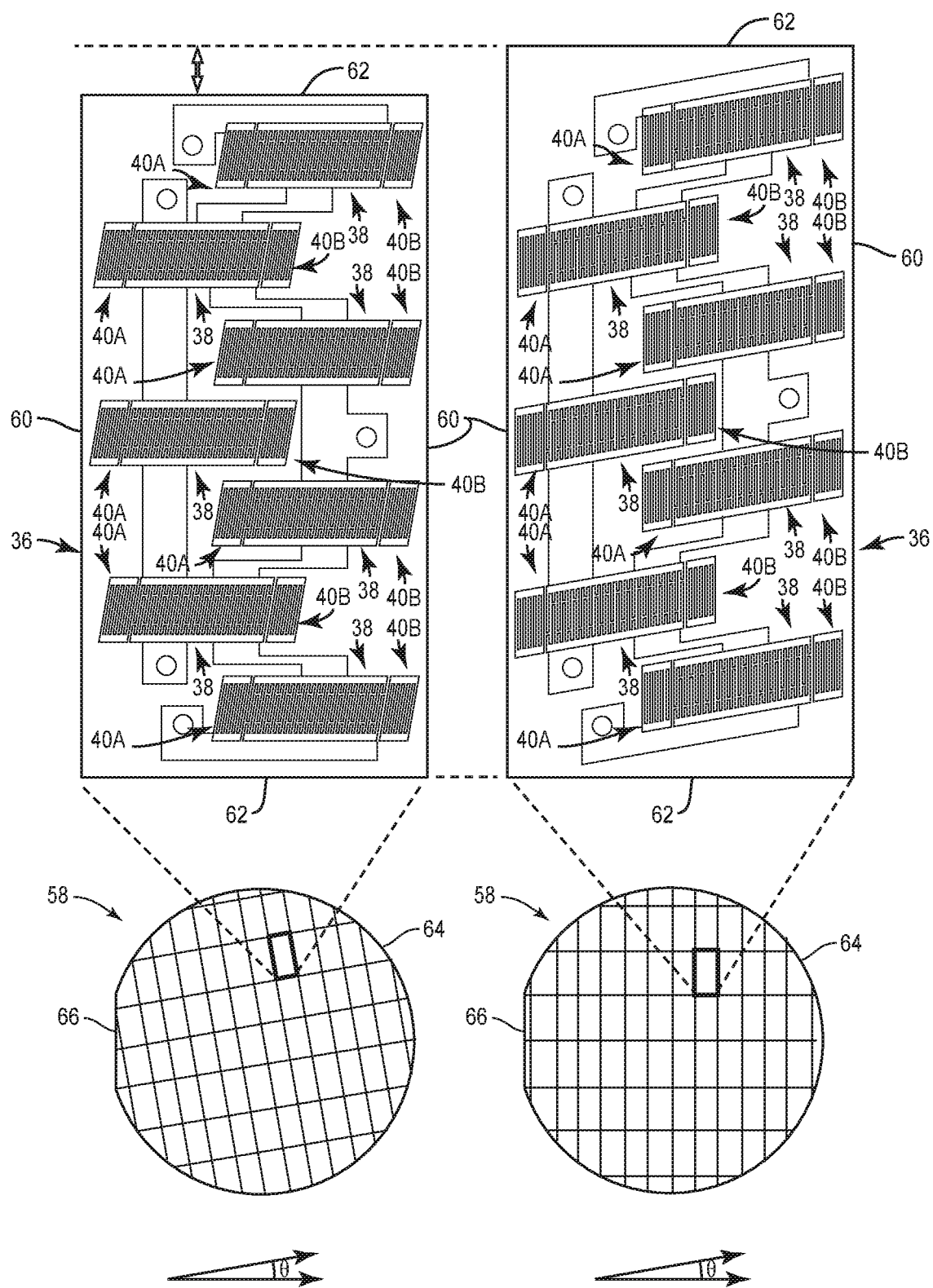
FIGS. 6A and 6B are top views of a wafer including a number of die each including a number of interdigital transducers with slanted apodization according to one embodiment of the present disclosure.

As discussed above, it is important to minimize the size of the die 32 of the guided SAW device 30, since space is often at a premium in consumer electronic devices in which the guided SAW device 30 may be used. Accordingly, FIGS. 6A and 6B illustrate different ways to arrange a number of interdigital transducers 38 and reflector structures 40 on the die 32 in order to minimize an area of the die 32. Further, FIGS. 6A and 6B illustrate the arrangement of multiple die 32 on a wafer 58 in order to minimize the size of the die 32 while also maximizing the number of die 32 attainable from the wafer 58. FIG. 6A shows an approach in which the bus bars 46 of a number of interdigital transducers 38 are oblique to the edges of the die 32. As shown, the die 32 is defined by a first set of parallel die edges 60 and a second set of parallel die edges 62. The bus bars 46 of the interdigital transducers 38 on the die 32 are oblique to both the first set of parallel die edges 60 and the second set of parallel die edges 62, while the electrode fingers 48 are parallel to the first set of parallel die edges 60 and perpendicular to the second set of parallel die edges 62. In this configuration, the die 32 is aligned with an orientation flat of the wafer 58. Specifically, an outer perimeter of the wafer 58 is defined by a circular segment 64 and a chord 66 intersecting the circular segment 64. The chord 66 defines an orientation flat of the wafer 58, and is used to position the wafer 58 in production equipment used for fabricating devices thereon, as will be appreciated by those skilled in the art. In the embodiment shown in FIG. 6A, the die 36 on the wafer are aligned with the chord 66 such that the first set of parallel die edges 60 thereof are parallel to the chord 66 and the second set of parallel die edges 62 are perpendicular to the chord 66.

To further decrease an area of the die 32, the interdigital transducers 38 and the reflector structures 40 can be arranged as shown in FIG. 6B, wherein the bus bars 46 of the interdigital transducers 38 are perpendicular to the first set of parallel die edges 60 and parallel to the second set of parallel die edges 62. Such a configuration can significantly reduce the area of the die 36 as illustrated by the dashed lines comparing a width of the die 36 shown in FIG. 6A to that shown in FIG. 6B. In this configuration, the die 36 are not aligned with the chord 66 that defines the orientation flat of the wafer 58. That is, both the first set of parallel die edges 60 and the second set of parallel die edges 62 of the die 36 on the wafer are oblique to the chord 66. Specifically, the first set of parallel die edges 60 may be arranged such that an angle between the chord 36 and the first set of parallel die edges is between 3° and 18°, or more specifically between 5° and 15°. Similarly, an angle between the chord 36 and the second set of parallel die edges 62 may be between 90°-3° and 90°-18°, or more specifically 90°-5° and 90°-15°.

Figure 7:
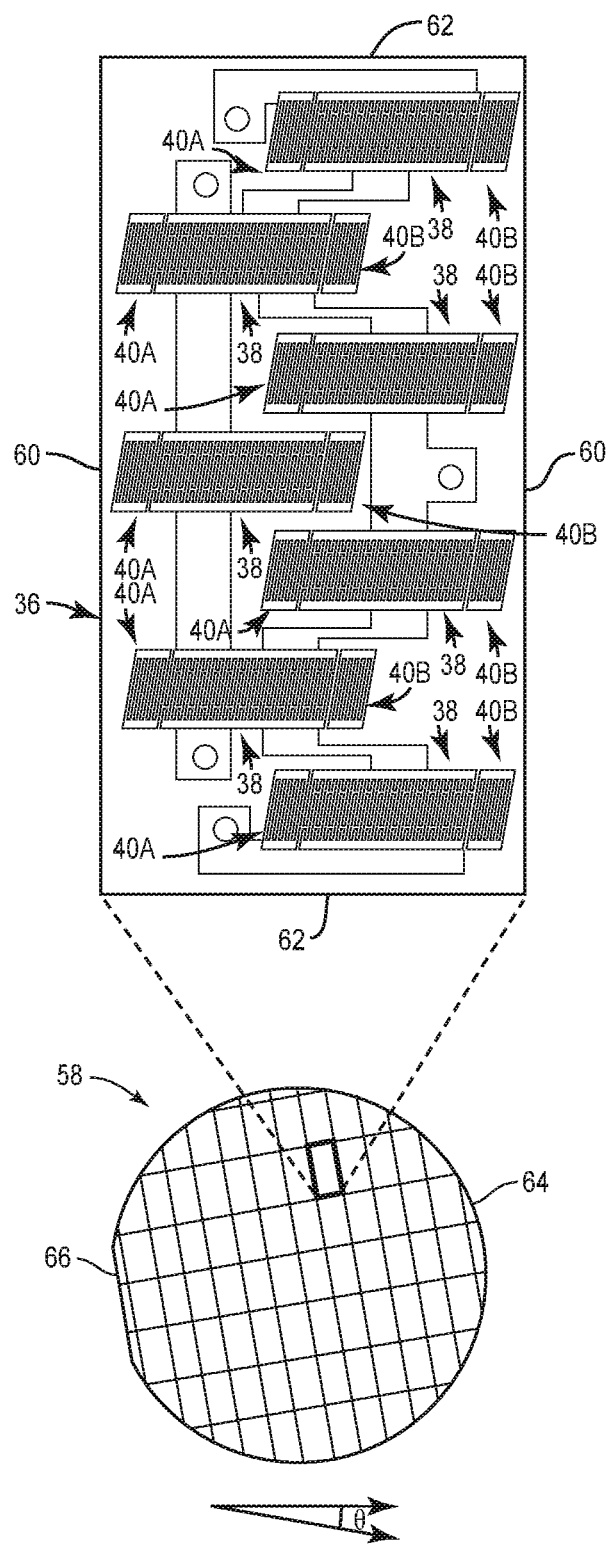
FIG. 7 is a top view of a wafer including a number of die each including a number of interdigital transducers with slanted apodization according to one embodiment of the present disclosure.

FIG. 7 shows the die 32 and wafer 58 according to one embodiment of the present disclosure. The die 32 shown in FIG. 7 is substantially similar to that shown in FIG. 6B, except that the orientation flat of the wafer 58 is changed to increase the yield of the wafer 58. As shown in FIG. 7, the orientation flat of the wafer 58 is essentially rotated such that the first set of parallel die edges 60 are parallel to the chord 66 while the second set of parallel die edges 62 are perpendicular to the chord 66. Such an arrangement of the die 36 on the wafer 58 may increase the number of die 36 yielded by the wafer 58.

Figure 8:
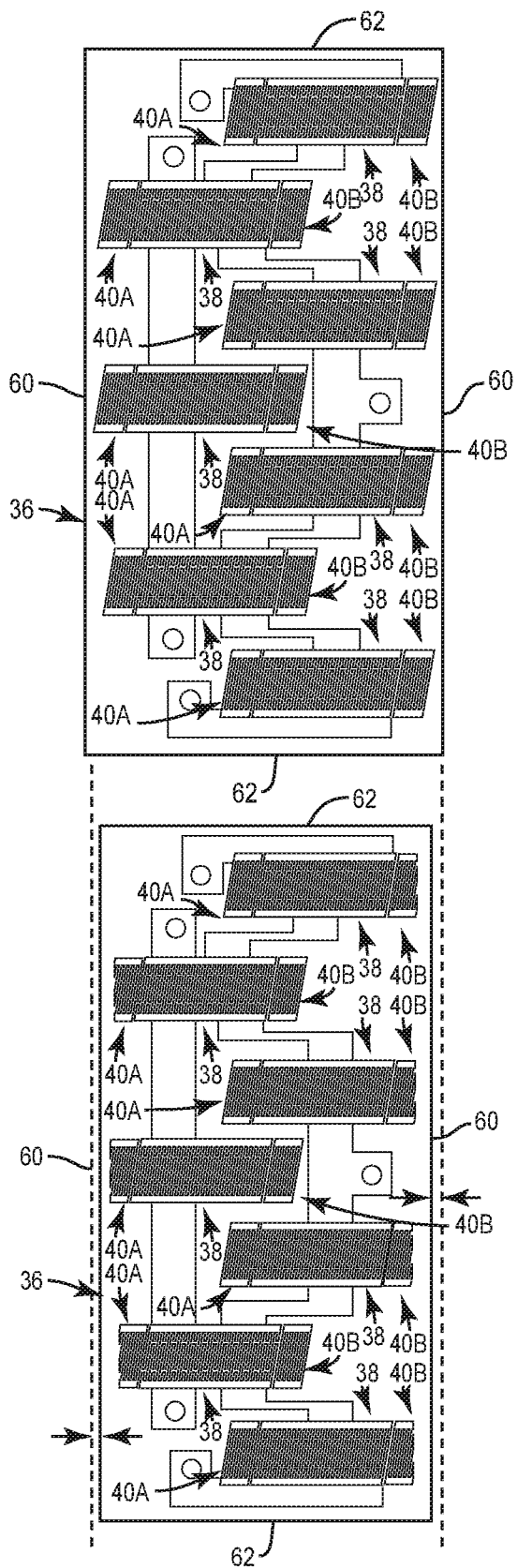
FIG. 8 is a top view of a number of die each including a number of interdigital transducers with slanted apodization according to one embodiment of the present disclosure.

FIG. 8 shows yet another way to reduce the area of the die 36 according to one embodiment of the present disclosure. As discussed above with respect to FIG. 4B, the outer lateral edges of the first reflector structure 40A and the second reflector structure 40B may be clipped in order to make the combined outer perimeter of the interdigital transducer 38 and the reflector structures 40 rectangular rather than parallelogrammatic and thus reduce a surface area thereof. FIG. 8 shows this concept applied to multiple interdigital transducers 38 and reflector structures 40 on the die 36. As discussed above, the reflector structures 40 may still adequately perform their function while being clipped in this manner. Accordingly, clipping the lateral edges of the reflector structures 38 as shown may reduce the area of the die 32 without affecting the performance thereof.

Figure 9:
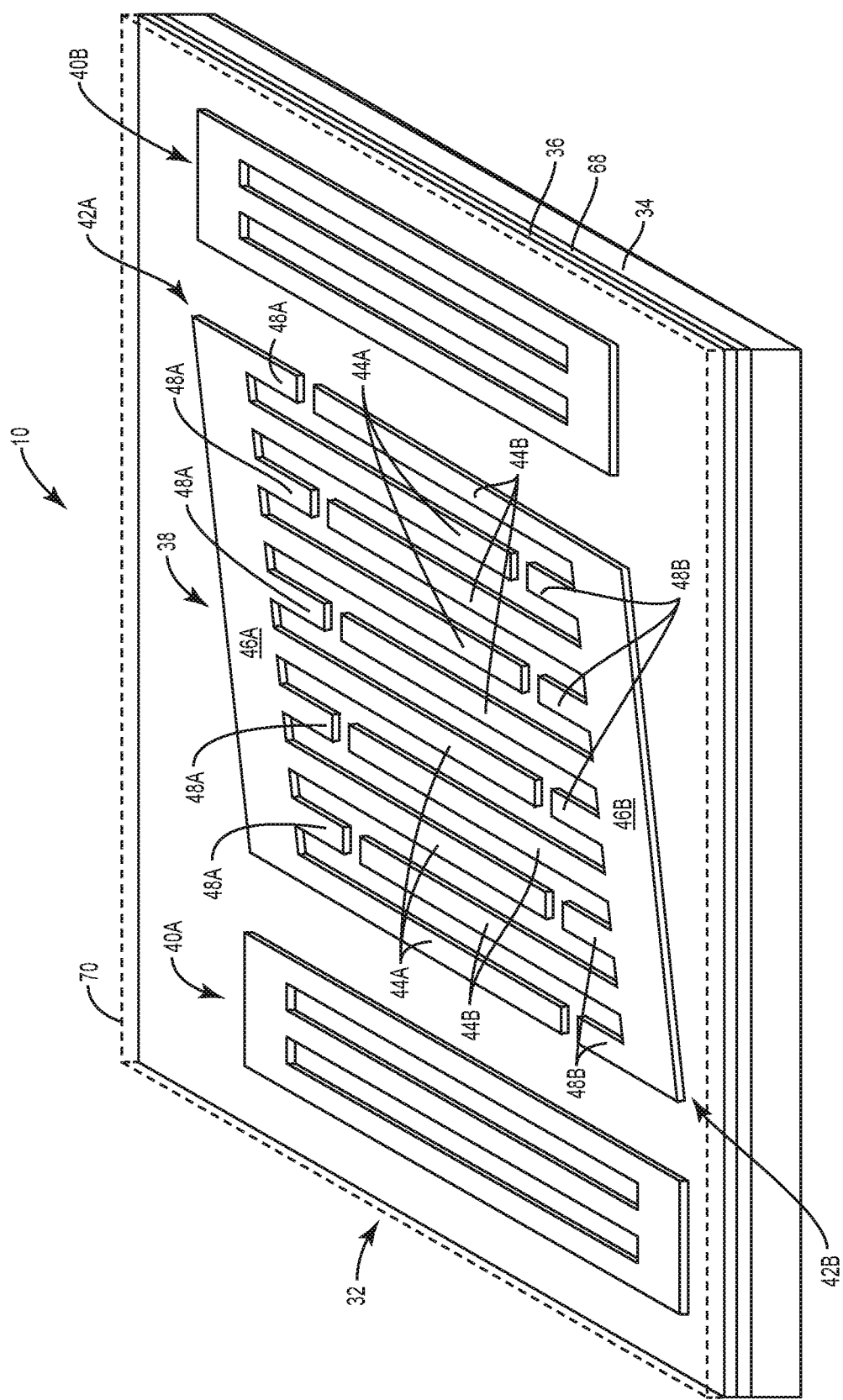
FIG. 9 illustrates a guided SAW device according to one embodiment of the present disclosure.

FIG. 9 shows the guided SAW device 30 according to an additional embodiment of the present disclosure. The guided SAW device 30 shown in FIG. 9 is substantially similar to that shown in FIG. 3A, except that the guided SAW device 30 further includes a non-conductive layer 68 between the substrate 34 and the piezoelectric layer 36. While only one non-conductive layer 68 is shown, the guided SAW device 30 may include any number of non-conductive layers 68 having the same or different compositions without departing from the principles of the present disclosure. The non-conductive layer 68 may comprise a dielectric such as silicon oxide or any other suitable material. The guided SAW device 30 also includes an overlayer 70, which is over the piezoelectric layer 36 such that the interdigital transducer 38 and the reflectors 40 are embedded in the overlayer 70. The overlayer 70 may comprise a dielectric layer such as silicon oxide. In particular, the overlayer 70 may comprise silicon oxide doped with one or more elements, such as Flourine.

Providing the interdigital transducer 38 as discussed above may allow the quality factor of the guided SAW device 30 to be greater than that of a SAW device using regular apodization or without apodization without any increase in size of the guided SAW device 30 compared to a non-apodized SAW device. While the guided SAW device 30 may provide improvements in electromechanical coupling coefficient over regularly apodized SAW devices, non-apodized SAW devices may provide a slightly higher electromechanical coupling coefficient. In particular, providing the interdigital transducer 38 as discussed may allow for a quality factor greater than 4400 and a quality factor greater than 10% with no increase in size compared to a non-apodized SAW device.

Figures 10A, 10B:
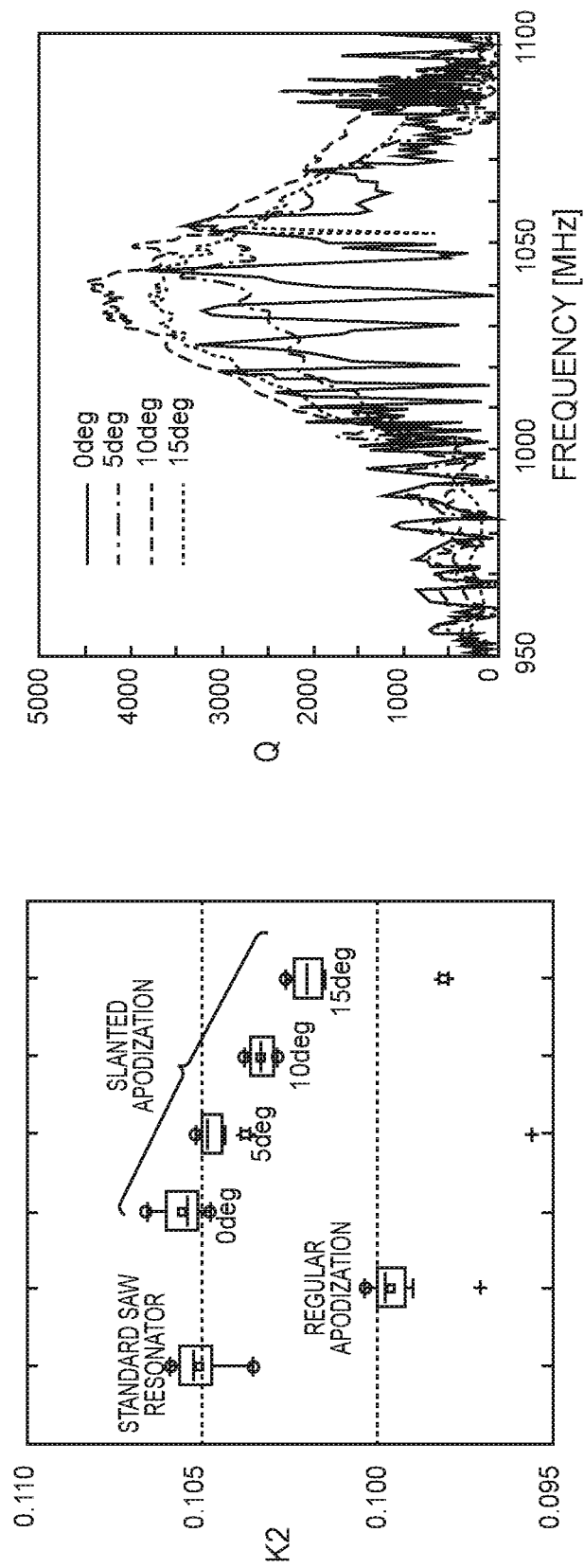
FIGS. 10A through 10C are graphs illustrating the performance of a guided SAW device according to various embodiments of the present disclosure.

FIG. 10A is a graph illustrating a relationship between electromagnetic coupling coefficient (K2) and the apodization used for the interdigital transducer 38. As illustrated, non-apodized SAW devices provide the highest electromechanical coupling coefficient. The apodization scheme discussed above with respect to the guided SAW device 30 also provides a very high electromechanical coupling coefficient such that it approaches that of a non-apodized SAW device. Regularly apodized SAW devices provide the lowest electromechanical coupling coefficient.

FIG. 10B is a graph illustrating a relationship between quality factor and the degree to which the electrode fingers 44 are slanted with respect to the bus bar 46 to which they are connected. As discussed above, the inventors discovered that an angle between 3° and 18°, positive or negative, and more specifically 5° and 15°, positive or negative, as measured from a normal to the bus bar 46 provides the best quality factor and electromechanical coupling coefficient. FIG. 10B illustrates the quality factor of the guided SAW device 30 when the angle between the electrode fingers 44 and the bus bar 46 to which they are connected is 0°, 5°, 10°, and 15°. As shown, the peak quality factor is achieved at 10°. However, as shown in FIG. 10A, the highest electromechanical coupling coefficient is achieved at 0°. Accordingly, the degree to which the electrode fingers 44 are slanted can be chosen to strike a balance between quality factor and electromechanical coupling coefficient.

Figure 10C:
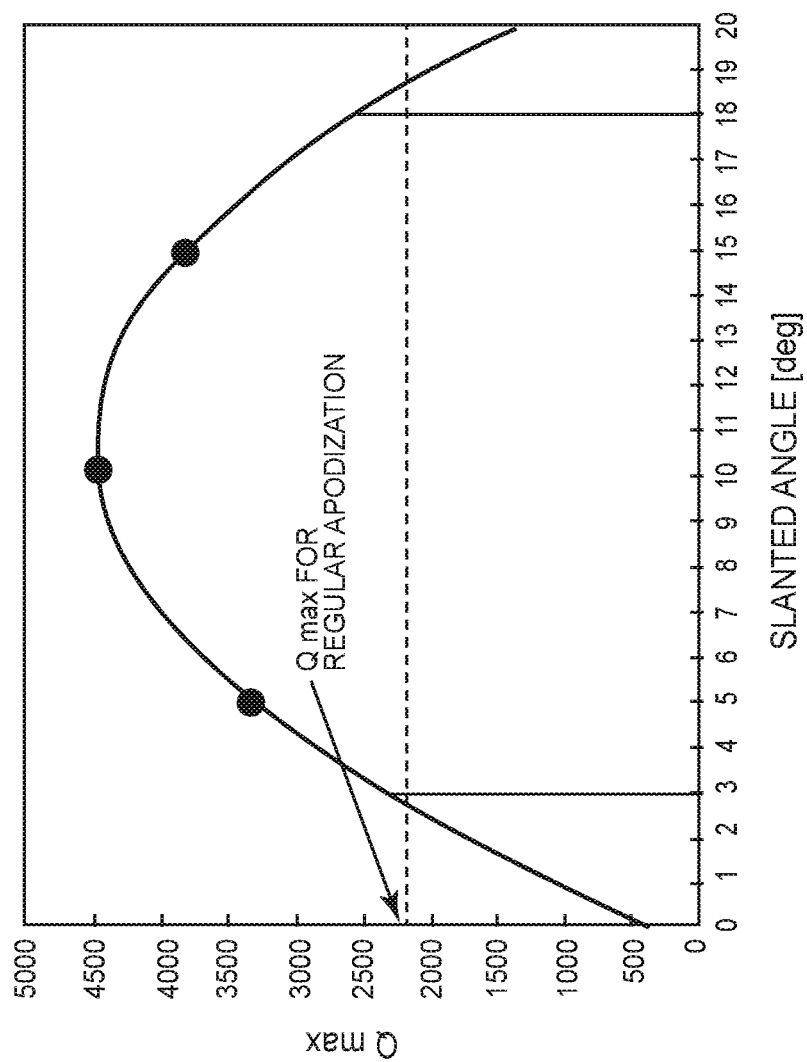

FIG. 10C is a graph illustrating a relationship between maximum quality factor and the degree to which the electrode fingers 44 are slanted with respect to the bus bar 46 to which they are connected. As shown, values between 3° and 18° provide a quality factor above that achieved by regularly apodized SAW devices, with the highest peak quality factor achieved in the middle of this range.

Those skilled in the art will recognize improvements and modifications to the preferred embodiments of the present disclosure. All such improvements and modifications are considered within the scope of the concepts disclosed herein and the claims that follow.

What is claimed is:

1. A guided surface acoustic wave (SAW) device comprising:
 a die comprising a substrate and a piezoelectric layer on the substrate, wherein the piezoelectric layer comprises one of lithium tantalate and lithium niobate and a thickness of the piezoelectric layer is less than two times a wavelength of a primary surface acoustic wave propagated in the piezoelectric layer (λ); and
 an interdigital transducer on the die, the interdigital transducer comprising:
  a first bus bar;
  a second bus bar parallel to the first bus bar; and
  a plurality of electrode fingers comprising:
   a first set of electrode fingers each extending obliquely from the first bus bar towards the second bus bar; and
   a second set of electrode fingers each extending obliquely from the second bus bar towards the first bus bar such that the first set of electrode fingers is parallel to and interleaved with the second set of electrode fingers.

2. The guided SAW device of claim 1 wherein:
 an angle between the first set of electrode fingers and a normal to the first bus bar is between 3° and 18°; and
 an angle between the second set of electrode fingers and a normal to the second bus bar is between 3° and 18°.

3. The guided SAW device of claim 2 wherein:
 the angle between the first set of electrode fingers and the normal to the first bus bar is between 5° and 15°; and
 the angle between the second set of electrode fingers and the normal to the second bus bar is between 5° and 15°.

4. The guided SAW device of claim 3 wherein:
 the angle between the first set of electrode fingers and the normal to the first bus bar is between 7° and 13'; and
 the angle between the second set of electrode fingers and the normal to the second bus bar is between 7° and 13°.

5. The guided SAW device of claim 4 wherein:
the angle between the first set of electrode fingers and the normal to the first bus bar is between 8° and 12°; and
the angle between the second set of electrode fingers and the normal to the second bus bar is between 8° and 12°.

6. The guided SAW device of claim 1 wherein:
an angle between the first set of electrode fingers and a normal to the first bus bar is between −3° and −18°; and
an angle between the second set of electrode fingers and a normal to the second bus bar is between −3° and −18°.

7. The guided SAW device of claim 6 wherein:
the angle between the first set of electrode fingers and the normal to the first bus bar is between −5° and −15°; and
the angle between the second set of electrode fingers and the normal to the second bus bar is between −5° and −15°.

8. The guided SAW device of claim 7 wherein:
the angle between the first set of electrode fingers and the normal to the first bus bar is between −7° and −13°; and
the angle between the second set of electrode fingers and the normal to the second bus bar is between −7° and −13°.

9. The guided SAW device of claim 8 wherein:
the angle between the first set of electrode fingers and the normal to the first bus bar is between −8° and −12°; and
the angle between the second set of electrode fingers and the normal to the second bus bar is between −8° and −12°.

10. The guided SAW device of claim 1 wherein the die further comprises a dielectric layer between the substrate and the piezoelectric layer.

11. The guided SAW device of claim 10 wherein the dielectric layer comprises an oxide.

12. The guided SAW device of claim 1 further comprising a pair of reflectors on the die such that the interdigital transducer is located between the pair of reflectors, wherein each one of the pair of reflectors comprises:
a first reflector bus bar and a second reflector bus bar parallel to the first reflector bus bar; and
a plurality of reflector bars running between the first reflector bus bar and the second reflector bus bar.

13. The guided SAW device of claim 12 wherein, for each one of the pair of reflectors:
the first reflector bus bar is collinear with the first bus bar and the second reflector bus bar is collinear with the second bus bar;
the plurality of reflector bars extend obliquely between the first reflector bus bar and the second reflector bus bar; and
the plurality of reflector bars are parallel to the plurality of electrode fingers.

14. The guided SAW device of claim 13 wherein each one of the pair of reflectors is trapezoidal.

15. The guided SAW device of claim 13 wherein:
a surface of the die on which the interdigital transducer is located is defined by a first pair of parallel die edges and a second pair of parallel die edges perpendicular to the first pair of parallel die edges such that the surface of the die is rectangular;
the first bus bar and the second bus bar are parallel to one of the first pair of parallel die edges and the second pair of parallel die edges; and
the plurality of electrode fingers are oblique to the first pair of parallel die edges and the second pair of parallel die edges.

16. The guided SAW device of claim 15 wherein for each one of the pair of reflectors, one of the first pair of parallel die edges and the second pair of parallel die edges intersect the first reflector bus bar, the second reflector bus bar, and at least one of the plurality of reflector bars such that each one of the pair of reflectors is trapezoidal.

17. The guided SAW device of claim 1 further comprising a plurality of dummy electrodes wherein the plurality of dummy electrodes comprises:
a first set of dummy electrodes each extending obliquely from the first bus bar in an alternating fashion with the first set of electrode fingers towards a corresponding one of the second set of electrode fingers; and
a second set of dummy electrodes each extending obliquely from the second bus bar in an alternating fashion with the second set of electrode fingers towards a corresponding one of the first set of electrode fingers, wherein a length of each one of the first set of dummy electrodes and a length of each one of the second set of dummy electrodes is greater than 1λ.

18. The guided SAW device of claim 17 wherein:
each of the first set of electrode fingers extends between the first bus bar and a first electrode finger termination edge, wherein the first electrode finger termination edge is parallel to the first bus bar such that each one of the first set of electrode fingers is not rectangular; and
each of the second set of electrode fingers extends between the second bus bar and a second electrode finger termination edge, wherein the second electrode finger termination edge is parallel to the second bus bar such that each one of the second set of electrode fingers is not rectangular.

19. The guided SAW device of claim 18 wherein:
each of the first set of dummy electrodes extends between the first bus bar and a first dummy electrode termination edge, wherein the first dummy electrode termination edge is parallel to the first bus bar such that each one of the first set of dummy electrodes is not rectangular; and
each of the second set of dummy electrodes extends between the second bus bar and a second dummy electrode termination edge, wherein the second dummy electrode termination edge is parallel to the second bus bar such that each one of the second set of dummy electrodes is not rectangular.

20. The guided SAW device of claim 1 wherein:
each of the first set of electrode fingers extends between the first bus bar and a first electrode finger termination edge, wherein the first electrode finger termination edge is parallel to the first bus bar such that each one of the first set of electrode fingers is not rectangular; and
each of the second set of electrode fingers extends between the second bus bar and a second electrode finger termination edge, wherein the second electrode finger termination edge is parallel to the second bus bar such that each one of the second set of electrode fingers is not rectangular.

21. The guided SAW device of claim 1 further comprising:
at least one additional interdigital transducer on the die adjacent to the interdigital transducer, the at least one additional interdigital transducer comprising:
a first additional bus bar collinear with the first bus bar;
a second additional bus bar collinear with the second bus bar; and an additional plurality of electrode fingers comprising:
- a first additional set of electrode fingers each extending obliquely from the first additional bus bar and parallel to the first set of electrode fingers; and
- a second additional set of electrode fingers each extending obliquely from the second additional bus bar such that the first additional set of electrode fingers is parallel to and interleaved with the second additional set of electrode fingers.

22. The guided SAW device of claim 1 wherein:
a surface of the die on which the interdigital transducer is located is defined by a first pair of parallel die edges and a second pair of parallel die edges perpendicular to the first pair of parallel die edges such that the surface of the die is rectangular;
the first bus bar and the second bus bar are parallel to one of the first pair of parallel die edges and the second pair of parallel die edges; and
the plurality of electrode fingers are oblique to the first pair of parallel die edges and the second pair of parallel die edges.

23. The guided SAW device of claim 22 wherein:
the die is part of a wafer comprising a plurality of die, wherein an outer perimeter of the wafer is defined by a circular segment and a chord; and
one of the first pair of parallel die edges and the second pair of parallel die edges is parallel to the chord.

24. The guided SAW device of claim 22 wherein:
the die is part of a wafer comprising a plurality of die, wherein an outer perimeter of the wafer is defined by a circular segment and a chord such that the chord defines an orientation flat of the wafer; and
the first pair of parallel die edges and the second pair of parallel die edges are oblique to the chord.

25. The guided SAW device of claim 1 wherein:
a surface of the die on which the interdigital transducer is located is defined by a first pair of parallel die edges and a second pair of parallel die edges perpendicular to the first pair of parallel die edges such that the surface of the die is rectangular;
the first bus bar and the second bus bar are oblique to the first pair of parallel die edges and the second pair of parallel die edges; and
the plurality of electrode fingers are parallel to one of the first pair of parallel die edges and the second pair of parallel die edges.

26. The guided SAW device of claim 25 wherein:
the die is part of a wafer comprising a plurality of die, wherein an outer perimeter of the wafer is defined by a circular segment and a chord; and
the first pair of parallel die edges and the second pair of parallel die edges are oblique to the chord.

27. The guided SAW device of claim 25 wherein:
the die is part of a wafer comprising a plurality of die, wherein an outer perimeter of the wafer is defined by a circular segment and a chord; and
the first pair of parallel die edges and the second pair of parallel die edges are parallel to the chord.

28. The guided SAW device of claim 1 wherein the piezoelectric layer comprises lithium tantalate.

29. The guided SAW device of claim 28 wherein the substrate comprises one of silicon, quartz, sapphire, spinel, and a ceramic material.

30. The guided SAW device of claim 1 further comprising a silicon oxide layer over the die such that the interdigital transducer is embedded in the silicon oxide layer.

31. The guided SAW device of claim 30 wherein the silicon oxide layer is a doped silicon oxide layer.

32. The guided SAW device of claim 1 wherein the thickness of the piezoelectric layer is less than the wavelength of the primary surface acoustic wave propagated in the piezoelectric layer (A).

33. The guided SAW device of claim 1 wherein the interdigital transducer is a first interdigital transducer coupled to a second interdigital transducer and a third interdigital transducer to form a coupled resonator filter.

* * * * *

UNITED STATES PATENT AND TRADEMARK OFFICE
CERTIFICATE OF CORRECTION

PATENT NO. : 11,095,266 B2
APPLICATION NO. : 15/728133
DATED : August 17, 2021
INVENTOR(S) : Shogo Inoue and Marc Solal It is certified that error appears in the above-identified patent and that said Letters Patent is hereby corrected as shown below:

In the Specification

Column 2, Line 24, replace "wavelength 2L" with --wavelength $\lambda$--.
Column 2, Line 25, replace "wherein the center frequency wavelength is the wavelength" with --wherein the center frequency wavelength $\lambda$ is the wavelength--.
Column 2, Line 28, replace "wavelength 2L" with --wavelength $\lambda$--.
Column 4, Line 7, replace "(L)" with --($\lambda$)--.
Column 6, Line 59, replace "wavelength 2L" with --wavelength $\lambda$--.
Column 6, Line 60, replace "wavelength 2L" with --wavelength $\lambda$--.
Column 6, Line 62, replace "Normally, the center frequency wavelength of a conven-" with --Normally, the center frequency wavelength $\lambda$ of a conven- --.
Column 8, Line 10, replace "center fequency wavelength 2L" with --center frequency wavelength $\lambda$--.
Column 8, Line 14, replace "wavelength 22" with --wavelength $2\lambda$--.

In the Claims

Claim 4, Column 12, Line 65, replace "13'" with --13°--.
Claim 32, Column 16, Line 34, "(A)" with --($\lambda$)--.

Signed and Sealed this
Fifth Day of October, 2021

Drew Hirshfeld
*Performing the Functions and Duties of the*
*Under Secretary of Commerce for Intellectual Property and*
*Director of the United States Patent and Trademark Office*